(12) United States Patent  
Chang et al.

(10) Patent No.: US 8,421,078 B2  
(45) Date of Patent: Apr. 16, 2013

(54) THIN FILM TRANSISTOR SUBSTRATE AND METHOD FOR MANUFACTURING SAME

(75) Inventors: Yu-Cheng Chang, Miao-Li (TW); Shuo-Ting Yan, Miao-Li (TW); Chao-Yi Hung, Miao-Li (TW)

(73) Assignee: Chimei Innolux Corporation, Miaoli County (TW)

( * ) Notice: Subject to any disclaimer, the term of this patent is extended or adjusted under 35 U.S.C. 154(b) by 882 days.

(21) Appl. No.: 12/460,489

(22) Filed: Jul. 20, 2009

(65) Prior Publication Data  
US 2010/0012938 A1    Jan. 21, 2010

(30) Foreign Application Priority Data  
Jul. 18, 2008    (TW) .............................. 97127346 A (51) Int. Cl.  
*H01L 29/04*    (2006.01)

(52) U.S. Cl.  
USPC ................ 257/59; 257/72; 349/123; 349/138

(58) Field of Classification Search ............... 257/59, 257/72, 635; 349/122, 123, 138  
See application file for complete search history.

(56) References Cited

U.S. PATENT DOCUMENTS

| 6,580,487 B1 | 7/2003 | Kim et al. |
| 6,646,707 B2 | 11/2003 | Noh et al. |
| 2007/0153204 A1* | 7/2007 | Kim et al. ..................... 349/141 |

FOREIGN PATENT DOCUMENTS

| JP | 3-249735 A | 11/1991 |
| JP | 10-10573 A | 1/1998 |

* cited by examiner

*Primary Examiner* — Matthew E Warren  
(74) *Attorney, Agent, or Firm* — Bacon & Thomas, PLLC

(57) ABSTRACT

A thin film transistor (TFT) substrate includes gate lines, data lines intersecting with the gate lines, a plurality of TFTs, pixel electrodes, and a common electrode insulating the gate lines, the data lines, the TFTs, and the pixel electrode. Each pixel electrode is connected to one of the gate lines and one of the data lines via one of the TFTs. A layer stack including an insulating layer and a passivation layer is sandwiched between the pixel electrodes and the common electrode.

16 Claims, 8 Drawing Sheets

THIN FILM TRANSISTOR SUBSTRATE AND METHOD FOR MANUFACTURING SAME

BACKGROUND

1. Technical Field

The present disclosure relates to thin film transistor (TFT) substrates and methods for manufacturing TFT substrates, and more particularly to a TFT substrate with at least two insulating layers between a common electrode and a pixel electrode, wherein the TFT substrate can be used in a fringe-field switching (FFS) mode liquid crystal display (LCD).

2. Description of Related Art

LCDs have the advantages of portability, low power consumption, and low radiation, and are widely used in portable electronic devices such as notebooks, personal digital assistants (PDAs), video cameras, and so on. Generally, LCDs intrinsically exhibit the phenomenon of a narrow viewing angle (or "narrow view"). That is, the appearance of a displayed image differs when view from different angles.

In order to widen the viewing angle of LCDs, some wide view angle mode LCDs have been developed. Such LCDs include in-plane switching (IPS) mode LCDs, FFS mode LCDs, and multi-domain vertical alignment (MVA) mode LCDs. A TFT substrate of an FFS mode LCD includes a common electrode, a plurality of pixel electrodes, and an insulating layer between the common electrode and the pixel electrodes. When the FFS mode LCD is in operation, a plurality of liquid crystal capacitors between the common electrode and the pixel electrodes generate fringe fields to twist liquid crystal molecules.

However, the liquid crystal capacitors are all relatively large, and typically cannot be fully charged during an average available charging time. As a result, the fringe fields of the common electrode and the pixel electrodes may be low, and the image quality of the FFS mode LCD is liable to be unsatisfactory.

What is needed is a TFT substrate that can overcome the described limitations, and a method for manufacturing such TFT substrate.

BRIEF DESCRIPTION OF THE DRAWINGS

The components in the drawings are not necessarily drawn to scale, the emphasis instead being placed upon clearly illustrating the principles of at least one embodiment of the invention. In the drawings, like reference numerals designate corresponding parts throughout the various views.

DETAILED DESCRIPTION

Reference will now be made to the drawings to describe certain exemplary embodiments of the present disclosure in detail.

Figure 1:
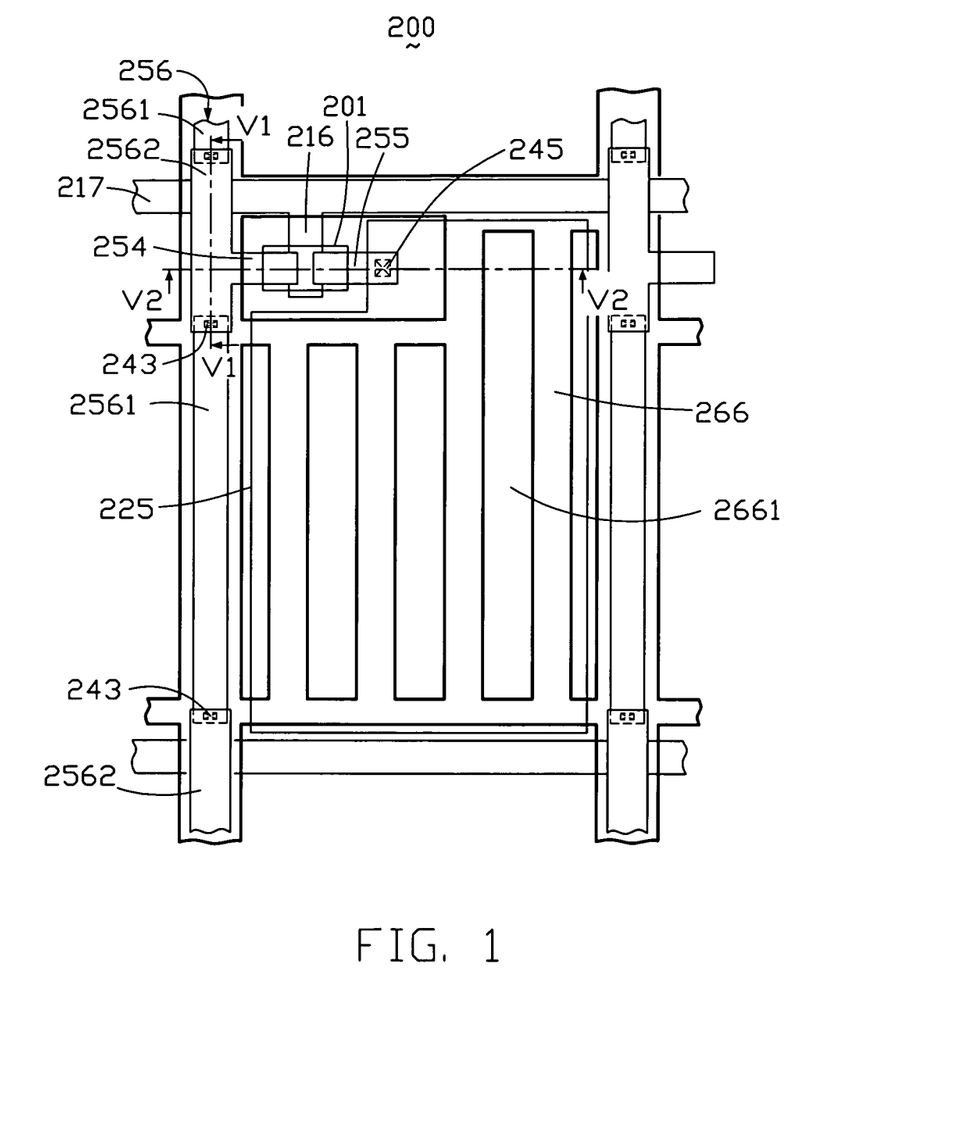
FIG. 1 is a top plan view of part of a TFT substrate of an FFS mode LCD according to an exemplary embodiment of the present disclosure.

FIG. 1 is a top plan view of part of a TFT substrate 200 of an FFS mode LCD according to an exemplary embodiment of the present disclosure. The TFT substrate 200 includes a plurality of gate lines 217, a plurality of data lines 256, a plurality of TFTs 201, a plurality of pixel electrodes 225, and a common electrode 266. The gate lines 217 are disposed parallel to each other. The data lines 256 are disposed parallel to each other, and substantially perpendicular to the gate lines 217. The data lines 256 are insulated from the gate lines 217. Each date line 256 includes a plurality of first portions 2561 and a plurality of second portions 2562. Each two adjacent first portions 2561 are electrically connected by one second portion 2562 and two first contact holes 243. In detail, one end of each second portion 2562 is connected to an end of one first portion 2561 via one first contact hole 243, and the other end of the second portion 2562 is connected to an end of the other first portion 2561 via the other first contact hole 243.

The data lines 256 and the gate lines 217 cooperatively define a plurality of pixel regions (not labeled) arranged in an array. Each pixel region includes a TFT 201 and a pixel electrode 225. Each TFT 201 is disposed at an intersection of one of the data lines 256 and one of the gate lines 217. A gate electrode 216 of the TFT 201 is connected to the corresponding gate line 217. A source electrode 254 of the TFT 201 is connected to a second portion 2562 of the corresponding data line 256. A drain electrode 255 of the TFT 201 is connected to the corresponding pixel electrode 225 via a second contact hole 245. The common electrode 266 defines a plurality of elongated, parallel openings 2661 at the pixel. This configuration enables the common electrode 266 and the pixel electrode 225 to generate fringe fields to twist liquid crystal molecules of an associated FFS mode LCD.

Figure 2:
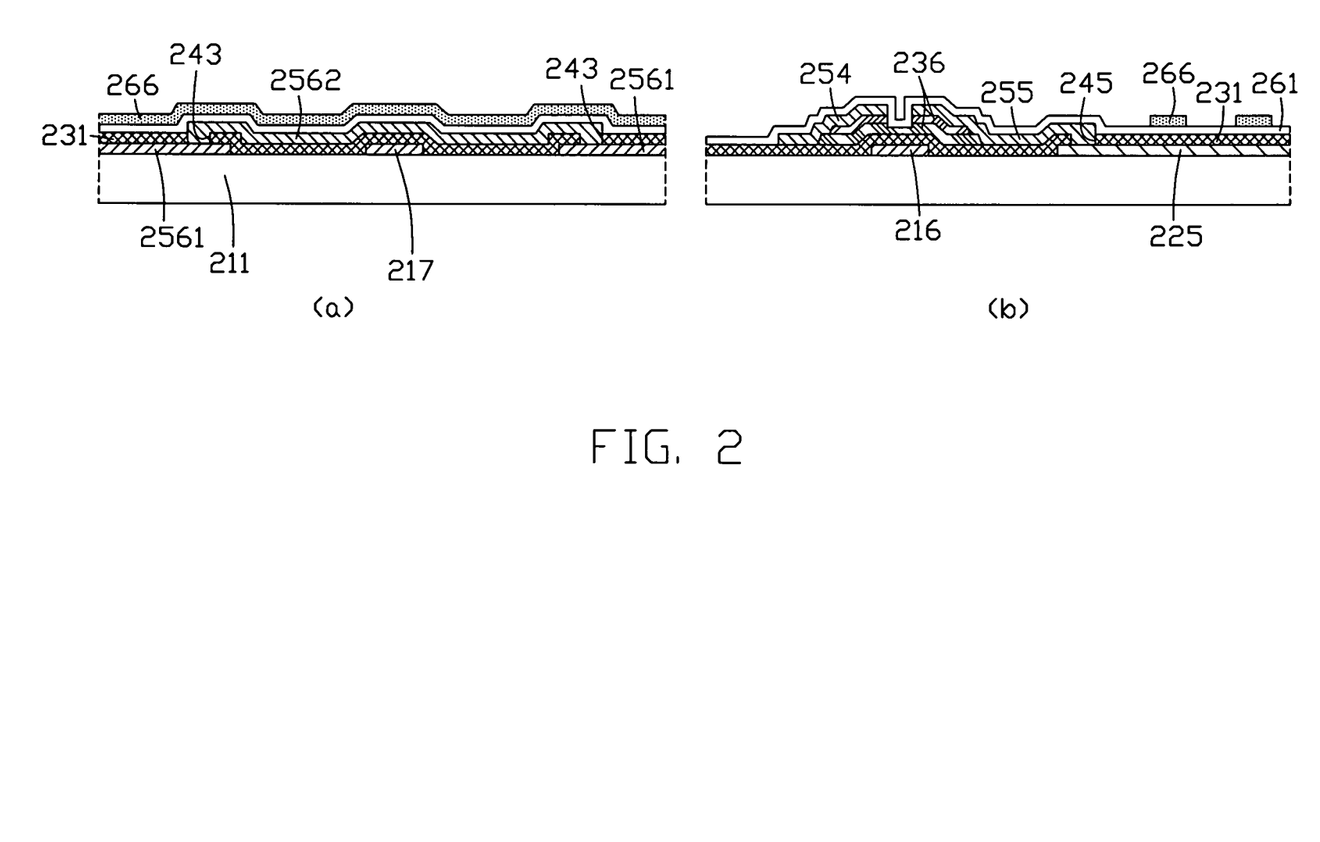
FIG. 2(a) is a cross section of the TFT substrate of FIG. 1 taken along line V1-V1 thereof.
FIG. 2(b) is a cross section of the TFT substrate of FIG. 1 taken along line V2-V2 thereof.

Referring also to FIG. 2(a) and FIG. 2(b), the gate electrodes 216, the gate lines 217, the first portions 2561 of the data lines 256, and the pixel electrodes 225 are disposed on a glass substrate 211. An insulating layer 231 is formed on the gate electrodes 216, the gate lines 217, the first portions 2561 of the data lines 256, and the pixel electrodes 225. The first contact holes 243 and the second contact holes 245 are formed in the insulating layer 231. The second portions 2562 of the data lines 256 are disposed on the insulating layer 231. Opposite ends of each second portion 2562 overlap ends of the corresponding first portions 2561, and are filled in the first contact holes 243 to contact the first portions 2561 respectively. Semiconductor layers 236 are formed on the insulating layer 231 in positions corresponding to the gate electrodes 216. The source electrodes 254 and the drain electrodes 255 are disposed on the semiconductor layers 236, and cover the semiconductor layers 236 and part of the insulating layer 231. The drain electrodes 255 contact the pixel electrodes 225 via the second contact holes 245, respectively. A passivation layer 261 is formed on the insulating layer 231, the second portions 2562 of the date lines 256, the source electrodes 254, and the drain electrodes 255. The common electrode 266 is formed on the passivation layer 261.

Figure 3:
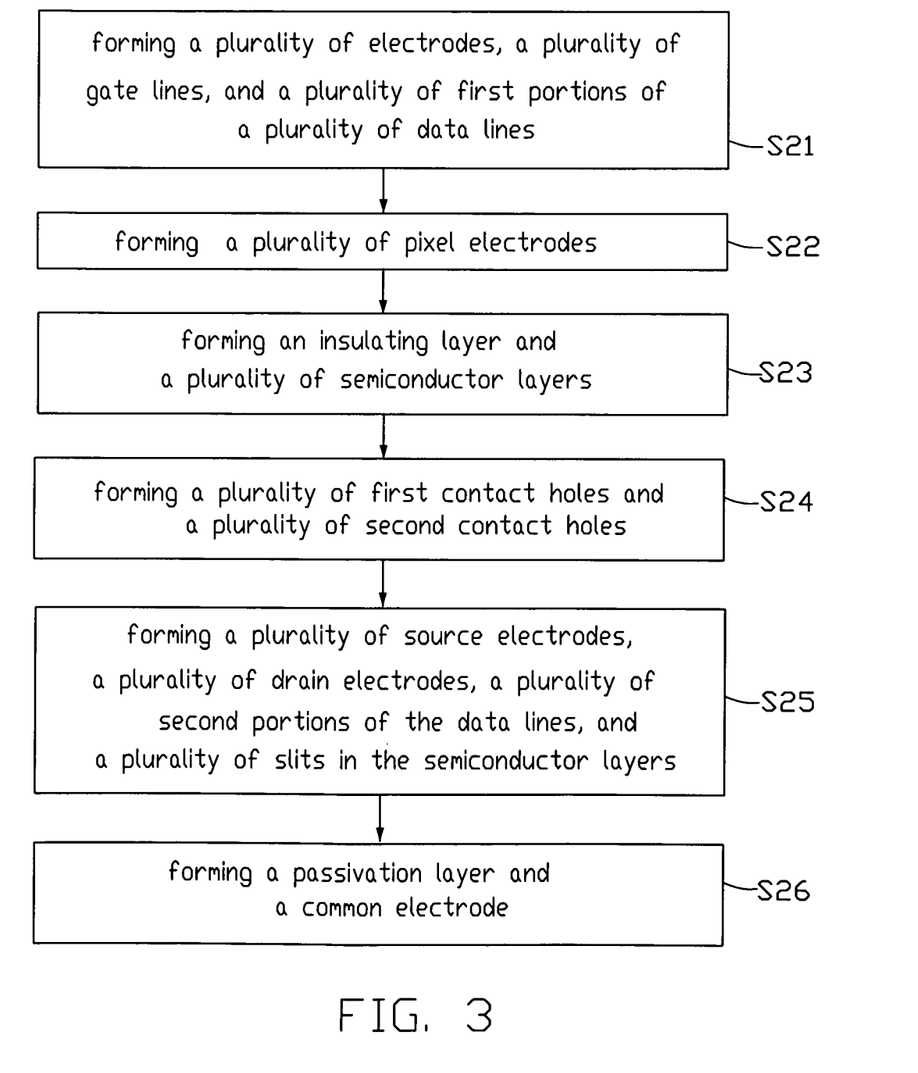
FIG. 3 is a flowchart of a method for manufacturing a TFT substrate, such as, for example, that of FIG. 1, according to a first method embodiment of the present disclosure.

FIG. 3 is a flowchart of a method for manufacturing a TFT substrate, such as, for example, that of FIG. 1, according to a first method embodiment of the present disclosure. The manufacturing method includes, in step S21, forming a plurality of electrodes, a plurality of gate lines, and a plurality of first portions of a plurality of data lines, in step S22, forming a plurality of pixel electrodes, in step S23, forming an insulating layer and semiconductor layers, in step S24, forming a plurality of first contact holes and a plurality of second contact holes, in step S25, forming a plurality of source electrodes, a plurality of drain electrodes, a plurality of second portions of the data lines, and a plurality of slits in the semiconductor layers, and in step S26, forming a passivation layer and a common electrode.

Figure 4:
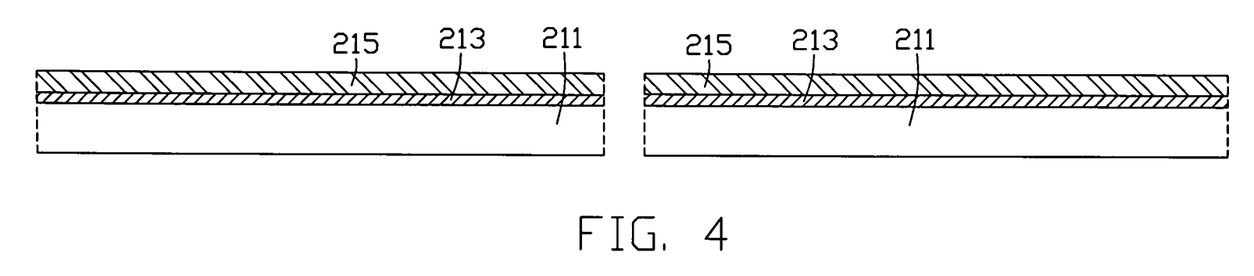
FIGS. 4-15 are cross-sections of successive steps in manufacturing the TFT substrate of FIG. 1 according to the method of FIG. 3.
Figure 5:
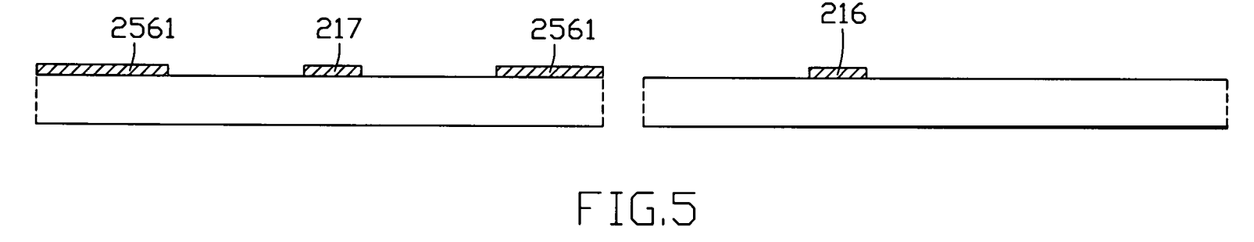

In step S21, referring to FIGS. 4-5, a glass substrate 211 is provided. A gate electrode layer 213 and a first photo resist 215 are formed sequentially on the glass substrate 211. The gate electrode layer 213 may have a single-layer structure or a multi-layer structure.

The first photo resist 215 is exposed using a first mask, and then the first photo resist 215 is developed to form a first photo resist pattern (not shown). The gate electrode layer 213 is etched using the first photo resist pattern as a mask, whereby the gate electrodes 216, the gate lines 217, and the first portions 2561 of the data lines 256 are formed. Each gate electrode 216 is connected to the corresponding gate line 217. The gate lines 217 are disposed substantially perpendicular to the first portions 2561 of the data lines 256. The residual first photo resist 215 is then removed.

Figure 6:
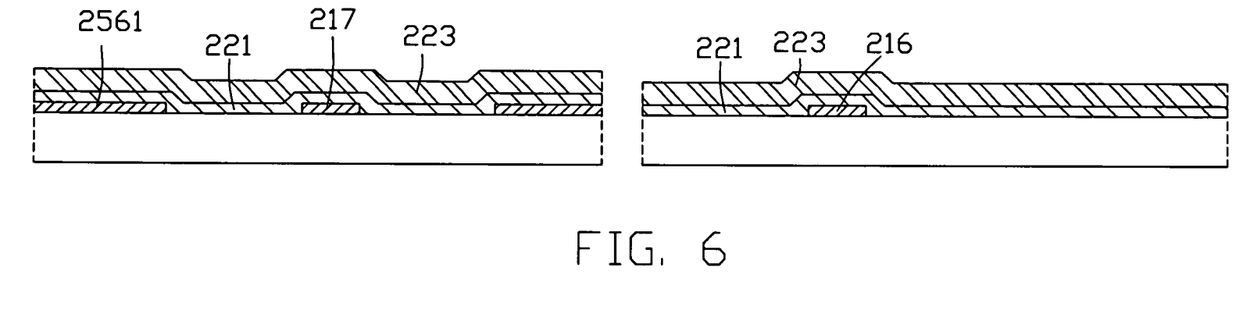
Figure 7:
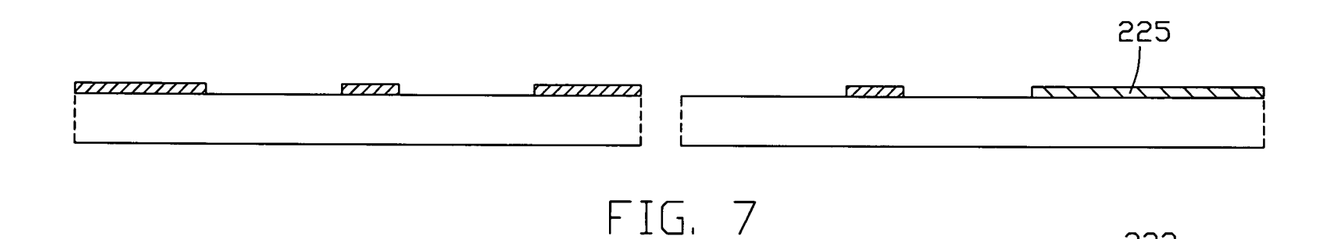

In step S22, referring to FIGS. 6-7, a first transparent conductive layer 221 and a second photo resist 223 are formed sequentially on the gate electrodes 216, the gate lines 217, and the first portions 2561 of the data lines 256. The second photo resist 223 is exposed using a second mask, and the second photo resist 223 is developed to form a second photo resist pattern (not shown). The first transparent conductive layer 221 is etched using the second photo resist pattern as a mask, whereby the pixel electrodes 225 are formed. The residual second photo resist 223 is then removed.

Figure 8:
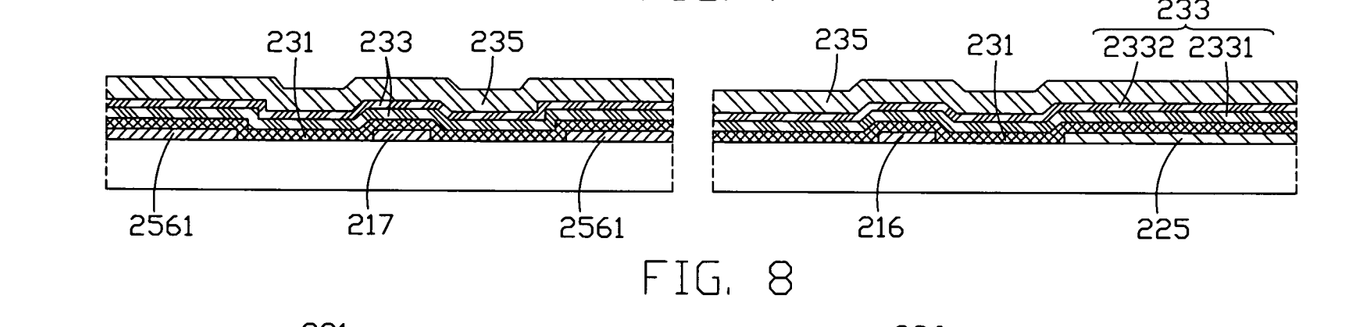
Figure 9:
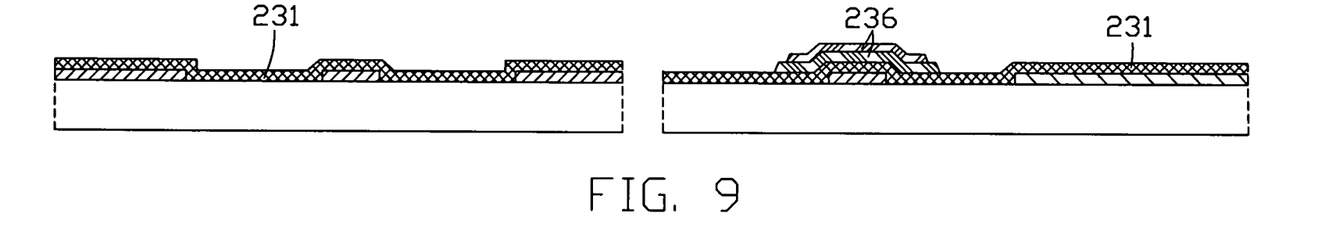

In step S23, referring to FIGS. 8-9, a silicon nitride (SiNx) layer is formed as an insulating layer 231 on the gate electrodes 216, the gate lines 217, the first portions 2561 of the data lines 256, and the pixel electrodes 225. A semiconductor film 233 and a third photo resist 235 are formed on the insulating layer 231 sequentially. The semiconductor film 233 may include an amorphous silicon film 2331 formed on the insulating layer 231, and a heavily doped amorphous silicon film 2332 formed on the amorphous silicon film 2331. The third photo resist 235 is exposed using a third mask, and then the third photo resist 235 is developed to form a third photo resist pattern (not shown). The semiconductor film 233 is etched using the third photo resist pattern as a mask, whereby the semiconductor layers 236 are formed. The residual third photo resist 235 is then removed.

Figure 10:
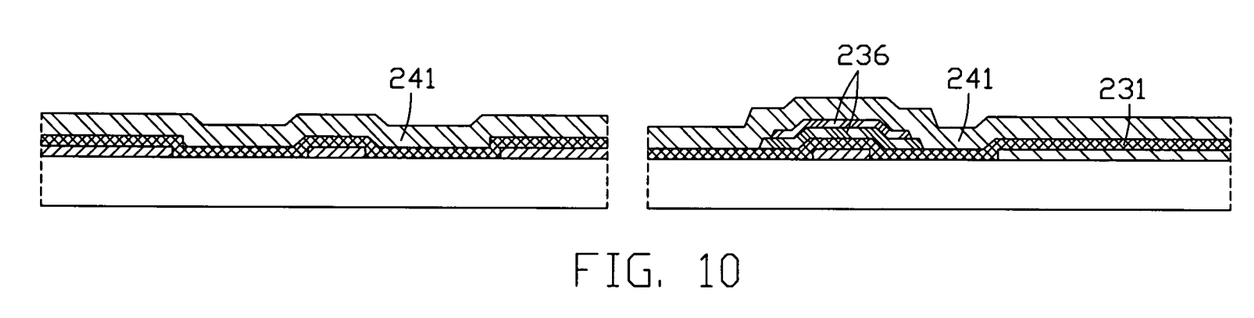
Figure 11:
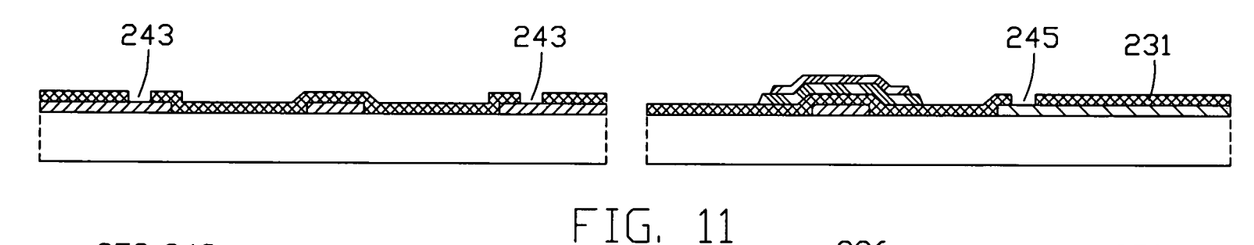

In step S24, referring to FIGS. 10-11, a fourth photo resist 241 is formed on the insulating layer 231 and the semiconductor layers 236. The fourth photo resist 241 is exposed using a fourth mask, and the fourth photo resist 241 is developed to form a fourth photo resist pattern (not shown). The insulating layer 231 is etched using the fourth photo resist pattern as a mask, whereby the first contact holes 243 and the second contact holes 245 are formed. The residual fourth photo resist 241 is then removed.

Figure 12:
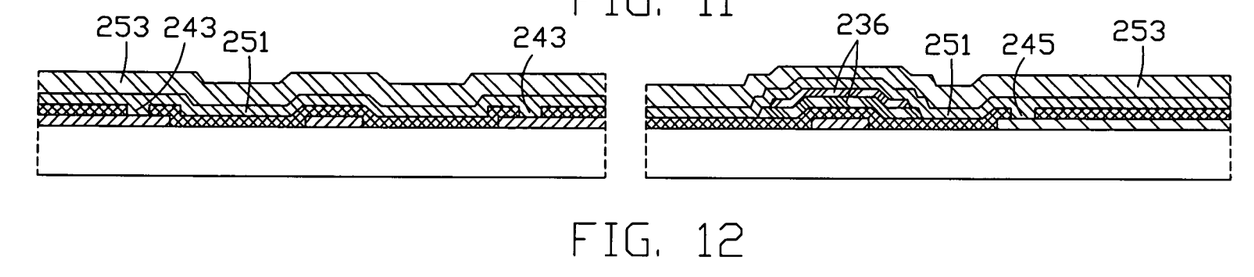
Figure 13:
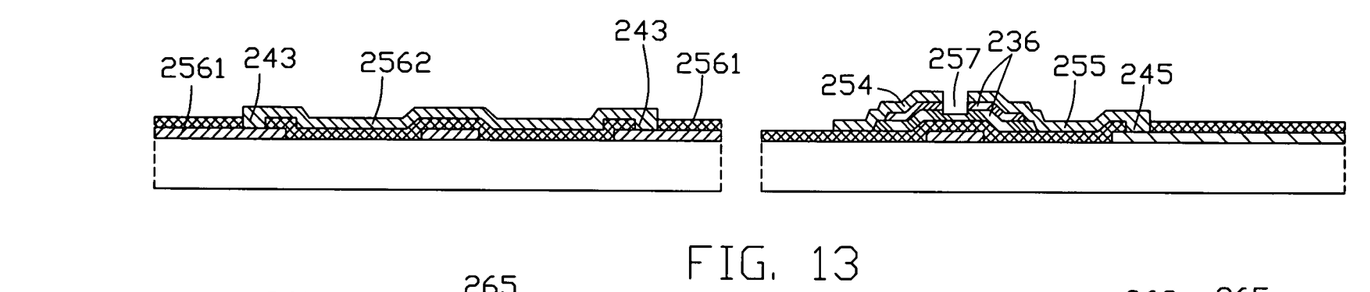

In step S25, referring to FIGS. 12-13, an electrode metal layer 251 and a fifth photo resist 253 are formed on the insulating layer 231, the semiconductor layers 236, the first contact holes 243, and the second contact holes 245 sequentially. The fifth photo resist 253 is exposed using a fifth mask, and the fifth photo resist 253 is developed to form a fifth photo resist pattern (not shown). The electrode metal layer 251 is etched using the fifth photo resist pattern as a mask, whereby the source electrodes 254, the drain electrodes 255, and the second portions 2562 of the data lines 256 (not shown) are formed. The semiconductor layers 236 are further etched to form slits 257. The residual fifth photo resist 253 is then removed. Each source electrode 254 is connected to the corresponding second portion 2562 of the corresponding data line 256. Each second portion 2562 of the data line 256 is disposed between two corresponding first portions 2561 of the data line 256, and links the two corresponding first portions 2561 via two corresponding first contact holes 243. Each drain electrode 255 is connected the corresponding pixel electrode 225 via the corresponding second contact hole 245.

Figure 14:
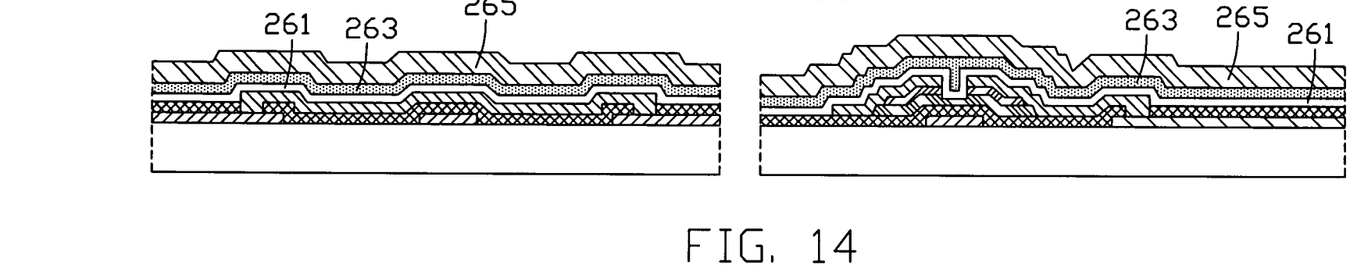
Figure 15:
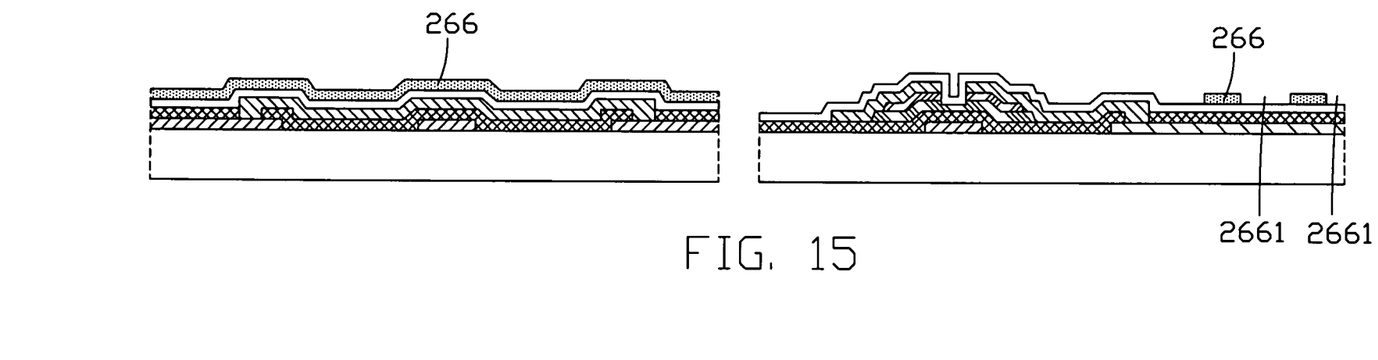

In step S26, referring to FIGS. 14-15, a passivation layer 261 is formed on the insulating layer 231, the source electrodes 254, the drain electrodes 255, the second portions 2562 of the data lines 256, and the slits 257. A second transparent conductive layer 263 and a sixth photo resist 265 are formed on the passivation layer 261 sequentially. The sixth photo resist 265 is exposed using a sixth mask, and then the sixth photo resist 265 is developed to form a sixth photo resist pattern (not shown). The second transparent conductive layer 263 is etched using the sixth photo resist pattern as a mask, whereby the common electrode 266 is formed. The residual sixth photo resist 263 is then removed. The common electrode 266 includes a plurality of elongated, parallel openings 2661.

Unlike in a conventional TFT substrate, two insulating layers being the insulating layer 231 and the passivation layer 261 are sandwiched between the pixel electrodes 225 and the common electrode 266, such that liquid crystal capacitors of the pixel electrodes 225 and the common electrode 266 are relatively small and can be fully charged during an average available charging time. The image quality of the associated FFS mode LCD using the TFT substrate 200 can be satisfactory. Moreover, the first portions 2561 and the second portions 2562 of the data lines 256 are formed at different layers, such that cross talk occurring in the common electrode 266 and the data lines 256 can be reduced.

Figure 16:
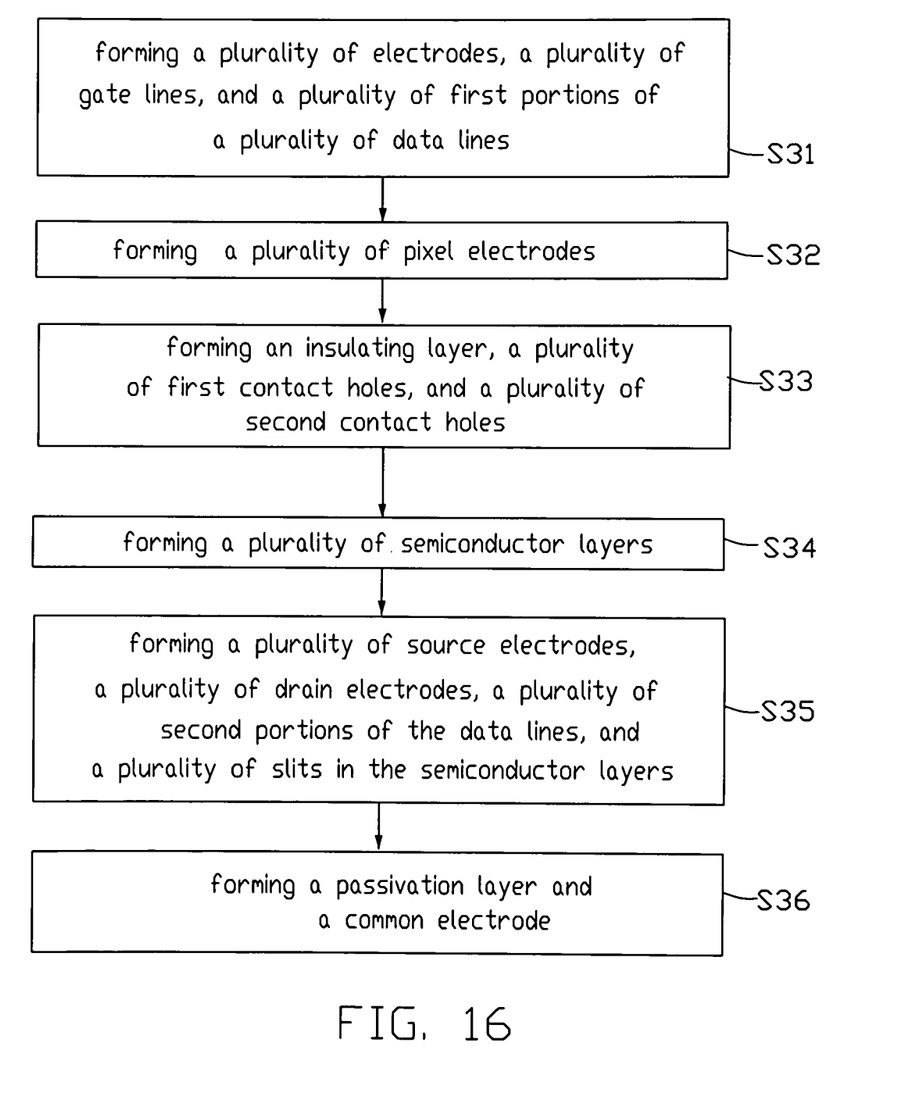
FIG. 16 is a flowchart of a method for manufacturing the TFT substrate of FIG. 1, according to a second method embodiment of the present disclosure.

FIG. 16 is a flowchart of a method for manufacturing the TFT substrate of FIG. 1 according to a second method embodiment of the present disclosure. The manufacturing method includes, in step S31, forming a plurality of electrodes, a plurality of gate lines, and a plurality of first portions of a plurality of data lines, in step S32, forming a plurality of pixel electrodes, in step S33, forming an insulating layer, a plurality of first contact holes, and a plurality of second contact holes, in step S34, forming a plurality of semiconductor layers, in step S35, forming a plurality of source electrodes, a plurality of drain electrodes, a plurality of second portions of the data lines, and a plurality of slits in the semiconductor layers; and in step S36, forming a passivation layer and a common electrode. The manufacturing method of the second embodiment differs from that of the first embodiment in that the first contact holes and the second contact holes are formed in step S33, and the semiconductor layers are formed in step S34. That is, in the second embodiment, the first contact holes and the second contact holes are formed prior to the forming of the semiconductor layers; whereas in the first embodiment, the first contact holes and the second contact holes are formed subsequent to the forming of the semiconductor layers.

It is to be understood, however, that even though numerous characteristics and advantages of the present embodiments have been set out in the foregoing description, together with details of the structures and functions of the embodiments, the descriptions are illustrative only; and that changes may be made in detail, especially in matters of shape, size and arrangement of parts within the principles of the invention to the full extent indicated by the broad general meaning of the terms in which the appended claims are expressed.

What is claimed is:

1. A thin film transistor (TFT) substrate, comprising:
a plurality of gate lines,
a plurality of data lines intersecting with the gate lines,
a plurality of TFTs, a plurality of pixel electrodes, each pixel electrode connected to one of the gate lines and one of the data lines via one of the TFTs, a common electrode insulated from the gate lines, the data lines, the TFTs, and the pixel electrode, and a layer stack is sandwiched between the pixel electrodes and the common electrode, the layer stack comprising an insulating layer and a passivation layer stacked one on the other;

wherein each data line comprises a plurality of first portions and a plurality of second portions, each two adjacent first portions being interconnected by a corresponding second portion; the insulating layer is disposed on the first portions of the data lines, and the second portions being disposed on the insulating layer.

2. The TFT substrate of claim 1, wherein the insulating layer is disposed on the gate lines, gate electrodes of the TFTs, and the pixel electrodes, the second portions connecting to the first portions in a plurality of first contact holes defined in the insulating layer.

3. The TFT substrate of claim 2, wherein source electrodes and drain electrodes of the TFTs are disposed on the insulating layer, each source electrode being connected to the corresponding second portion of the corresponding data line, and each drain electrode being connected to the corresponding pixel electrode in a corresponding second contact hole defined in the insulating layer.

4. The TFT substrate of claim 3, wherein the passivation layer covers the source electrodes and drain electrodes of the TFTs, the second portions of the data lines, and portions of the insulating layer.

5. The TFT substrate of claim 4, wherein the common electrode is disposed on the passivation layer.

6. The TFT substrate of claim 5, wherein the common electrode comprises a plurality of openings.

7. The TFT substrate of claim 6, wherein the openings are elongate and parallel to each other.

8. The TFT substrate of claim 1, wherein the gate lines are parallel to each other, and are substantially perpendicular to the data lines.

9. A thin film transistor (TFT) substrate, comprising:
a substrate,
a plurality of gate electrodes, a plurality of gate lines, a plurality of first portions of a plurality of data lines, and a plurality of pixel electrodes all disposed on the substrate,
an insulating layer covering the gate electrodes, the gate lines, the first portions of the data lines, and the pixel electrodes,
a plurality of first contact holes and a plurality of second contact holes defined in the insulating layer,
a plurality of semiconductor layers disposed on the insulating layer,
a plurality of source electrodes and a plurality of drain electrodes disposed on the semiconductor layers and part of the insulating layer, each drain electrode being connected to a corresponding pixel electrode in a corresponding second contact hole,
a plurality of second portions of the data lines disposed on the insulating layer, the second portions of each data line being connected to the first portions of the data line in corresponding first contact holes,
a passivation layer covering the source electrodes, the drain electrodes, the second portions of the data lines, and part of the insulating layer, and
a common electrode disposed on the passivation layer,
wherein each two adjacent first portions of each data line are connected by one corresponding second portion of the data line via two corresponding first contact holes.

10. The TFT substrate of claim 9, wherein each source electrode is connected to the corresponding second portion of the corresponding data line.

11. The TFT substrate of claim 10, wherein the common electrode comprises a plurality of openings.

12. The TFT substrate of claim 11, wherein the openings are elongate and parallel to each other.

13. A method for manufacturing a thin film transistor (TFT) substrate of claim 9, the method comprising:
providing a substrate,
forming a plurality of gate electrodes, a plurality of gate lines, and a plurality of first portions of a plurality of data lines on the substrate,
forming a plurality of pixel electrodes on the substrate,
forming an insulating layer on the gate electrodes, the gate lines, the first portions of the data lines, and the pixel electrodes,
forming a plurality of first contact holes and a plurality of second contact holes in the insulating layer,
forming a plurality of semiconductor layers on the insulating layer,
forming a plurality of source electrodes, a plurality of drain electrodes, and a plurality of second portions of the data lines, each drain electrode being connected to a corresponding pixel electrode in a corresponding second contact hole, the second portions of each data line being connected to the first portions of the data line in corresponding first contact holes,
forming a passivation layer on the source electrodes, the drain electrodes, the second portions of the data lines, and part of the insulating layer, and
forming a common electrode on the passivation layer;
wherein each two adjacent first portions of each data line are connected by one corresponding second portion of the data line in two corresponding first contact holes.

14. The method of claim 13, wherein each source electrode is connected to a corresponding second portion of the corresponding data line.

15. The method of claim 13, wherein the common electrode comprises a plurality of openings.

16. The method of claim 15, wherein the openings are elongate and parallel to each other.

* * * * *